United States Patent [19]
Pan et al.

[11] Patent Number: 5,533,634
[45] Date of Patent: Jul. 9, 1996

[54] QUANTUM CHROMELESS LITHOGRAPHY

[75] Inventors: Hong-Tsz Pan, Chang-hua; Ming-Tzong Yang; Shyi-Long Shy, both of Hsinchu, all of Taiwan

[73] Assignee: United Microelectronics Corporation, Hsinchu, Taiwan

[21] Appl. No.: 299,458

[22] Filed: Sep. 1, 1994

[51] Int. Cl.$^6$ ..................................................... B44C 1/22
[52] U.S. Cl. ................... 216/12; 216/24; 216/67
[58] Field of Search ..................... 216/11, 12, 24, 216/45, 67; 156/643.1, 657.1, 659.11, 345; 430/5, 323

[56] References Cited

U.S. PATENT DOCUMENTS

| | | | |
|---|---|---|---|
| 4,780,175 | 10/1988 | Taneya et al. | 216/24 |
| 5,045,417 | 9/1991 | Okamoto | 430/5 |
| 5,100,508 | 3/1992 | Yoshida et al. | 156/661.11 |
| 5,190,836 | 3/1993 | Nakagawa et al. | 430/5 |
| 5,194,344 | 3/1993 | Cathey, Jr. et al. | 430/5 |
| 5,194,345 | 3/1993 | Rolfson | 430/5 |
| 5,194,346 | 3/1993 | Rolfson et al. | 430/5 |
| 5,208,125 | 5/1993 | Lowrey et al. | 430/5 |
| 5,217,830 | 6/1993 | Lowrey | 430/5 |
| 5,225,035 | 7/1993 | Rolfson | 156/643 |

OTHER PUBLICATIONS

"Lithography's Leading Edge—Part I: Phase–Shift Technology" pub. in Semiconductor International Feb. 1992 pp. 42–47.

*Primary Examiner*—William Powell
*Attorney, Agent, or Firm*—George O. Saile; Larry J. Prescott

[57] ABSTRACT

This invention describes the use and method of fabrication of a chromeless quantum phase shift mask and of a chromeless quantum phase shift build-on blank. The build-on blank can be readily inspected, stored for future use, and completed with a feature pattern when needed. The quantum phase shift mask provides improved image resolution and depth of focus tolerance. The quantum phase shift mask requires little or no CAD, or computer aided design, modification over that used for conventional masks.

28 Claims, 7 Drawing Sheets

5,533,634

QUANTUM CHROMELESS LITHOGRAPHY

BACKGROUND OF THE INVENTION

1. Field of the Invention

The invention relates to the use of a phase shifting mask to improve resolution in the fabrication of sub-micron integrated circuits and more particularly to the fabrication and use of a quantum phase shift mask without chrome and a quantum phase shift build-on blank without chrome. The quantum phase shift build-on blank is readily inspected and can be easily stored for later completion and use.

2. Description of Related Art

As optical lithography advances to 0.5 to 0.35 microns and below new technologies are needed to improve the resolution of the imaging lens. Phase-shifting photomasks have been used to improve resolution as well as depth of focus. The use of phase-shifting photomasks are described in a number of places, for example U.S. Pat. No. 5,045,417 to Okamoto or U.S. Pat. No. 5,268,244 to Yoo. A transparent coating of thickness t=0.5L/(n−1) (L=wavelength, n=index of refraction) is placed on a mask. The phase of the electric field of the light passing through the coated area is delayed 180° compared to the electric field of light passing through uncoated regions. At the boundary between the coated and uncoated regions the electric fields cancel producing an electric field null as well as an intensity null. This intensity null produces a sharper image as well as improved depth of focus at the integrated circuit wafer.

Phase shifting techniques have been described using several configurations. U.S. Pat. No. 5,190,836 to Nakagawa et al describes a reflection type photomask using phase shifting techniques. U.S. Pat. No. 5,194,345 to Rolfson describes rim phase shifters wherein phase shifting material is deposited on top of opaque material and extends beyond the opaque material in an overhang configuration thereby improving image resolution. U.S. Pat. No. 5,194,344 to Cathey, Jr. et al, U.S. Pat. No. 5,194,346 to Rolfson et al, U.S. Pat. No. 5,208,125 to Lowrey et al, U.S. Pat. No. 5,217,830 to Lowrey, and U.S. Pat. No. 5,225,035 to Rolfson describe various types of phase shifting masks and techniques. "LITHOGRAPHY'S LEADING EDGE, PART 1: PHASE-SHIFT TECHNOLOGY" published in Semiconductor International February 1992 pages 42–47 shows a number of phase shifting masks and techniques including a chromeless shifter.

While improvements have been made in image resolution and depth of field, the linear dimensions used in integrated circuit technology call for even greater improvements in resolution and increased depth of field.

SUMMARY OF THE INVENTION

It is a principle object of this invention to provide a quantum phase shift build-on blank without chromium which can be readily inspected. Masks are then formed from these build-on blanks for use in the fabrication of integrated circuits where superior image resolution is required. The build-on blanks can be easily and accurately inspected and they can be formed and stored until they are needed for mask formation.

It is a further object of the invention to provide a quantum phase shift mask without chromium for use in the fabrication of integrated circuits where superior image resolution is required.

It is a further object of the invention to provide a method for forming a quantum phase shift build-on blank without chromium.

It is a further object of the invention to provide a method of forming a quantum phase shift mask without chromium for use in fabrication of integrated circuits where improved image resolution is required. The CAD, or computer aided design, modifications required to form the quantum phase shift mask rather than a conventional photomask are easier than modifications required to form a conventional phase shift mask.

It is a further object of the invention to provide a method of forming a quantum phase shift mask without chromium from a quantum phase shift build-on blank which has been previously formed, inspected, and stored. The CAD, or computer aided design, used for conventional masks can be used with little or no change in forming this mask.

These objectives are accomplished by forming a build-on blank comprised of a layer of an array of areas of phase shifting material adjacent to areas of no phase shifting material on a quartz substrate. The areas of phase shifting material and areas of no phase shifting material are about 0.1 to 0.5 microns by 0.1 to 0.5 microns. These blanks have the advantage of being easily inspected due to the regular nature of the array and can be stored until needed. Then a mask is formed by forming a feature pattern in the layer of an array of areas of phase shifting material adjacent to areas of no phase shifting material. When the mask is used light is projected through the mask onto an integrated circuit wafer using a 5X stepper so that the pattern is reduced by five times. The areas of phase shifting material and no phase shifting material project areas of about 0.02 to 0.1 microns by 0.02 to 0.1 microns at the wafer surface. Interference between the light passing through areas of phase shifting material and light passing through adjacent areas of no phase shifting material causes an intensity null corresponding to the feature pattern at the wafer surface. The image resolution is improved by about 30% compared to that achieved using a conventional mask.

The objectives are also achieved by forming a mask comprising a feature pattern of an array of areas of phase shifting material adjacent to areas of no phase shifting material on a quartz substrate. The use of the mask in the fabrication of integrated circuit wafers then proceeds as described above.

DESCRIPTION OF THE PREFERRED EMBODIMENTS

Figure 1:
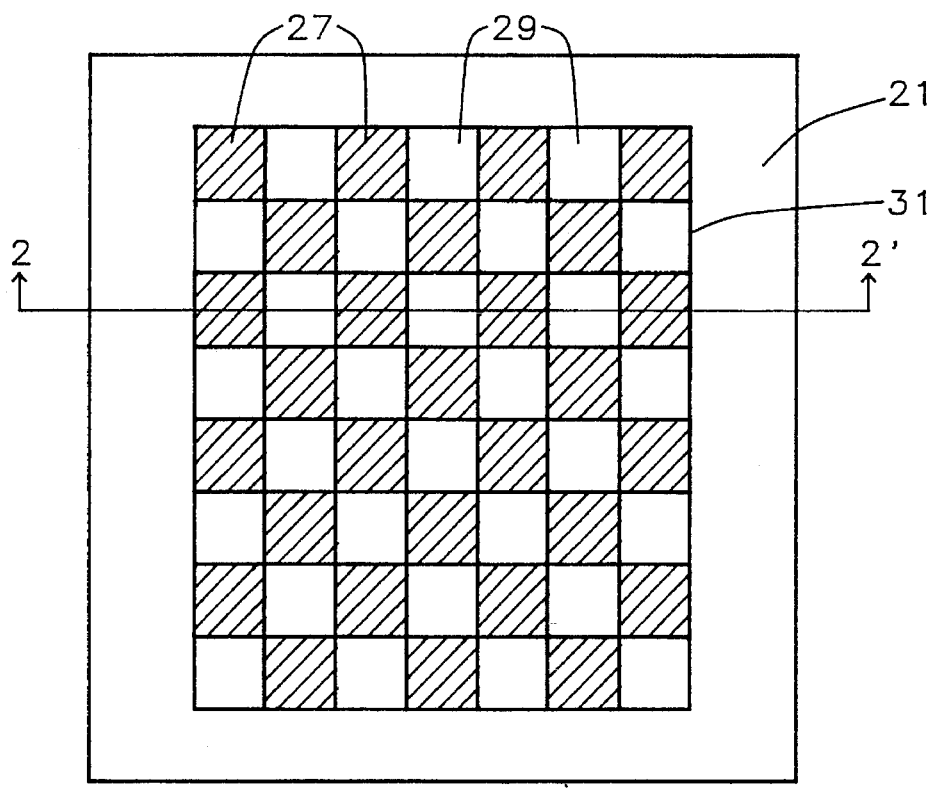
FIG. 1 shows the top view of a part of the quantum phase shift mask showing a part of the feature pattern.
Figure 2:
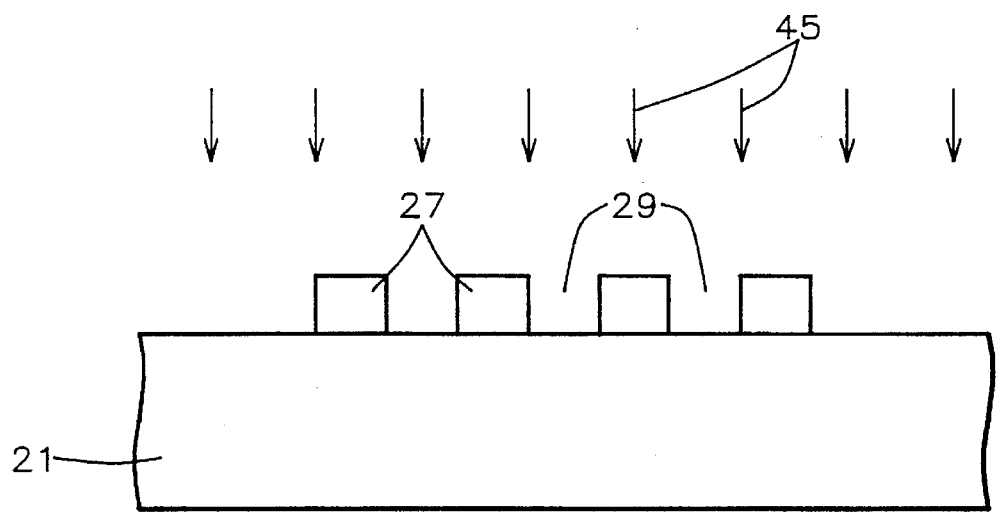
FIG. 2 shows a cross sectional view at 2–2' of the quantum phase shift mask.
Figure 3:
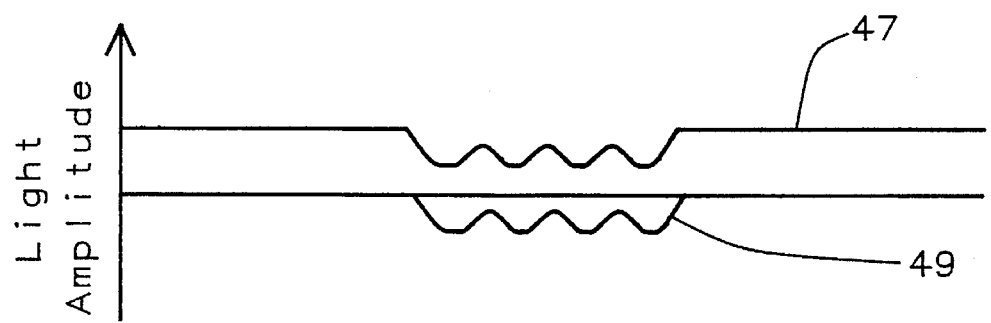
FIG. 3 shows the amplitude of the light passing through the quantum phase shift mask.
Figure 4:
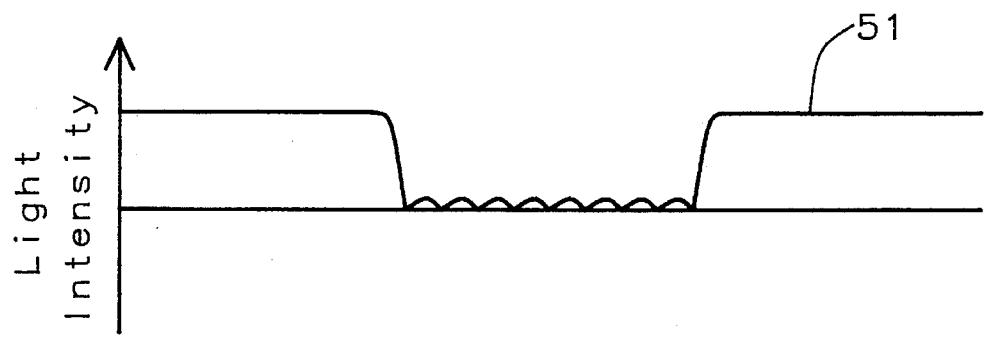
FIG. 4 shows the intensity of the light at the integrated circuit wafer.
Figure 5:
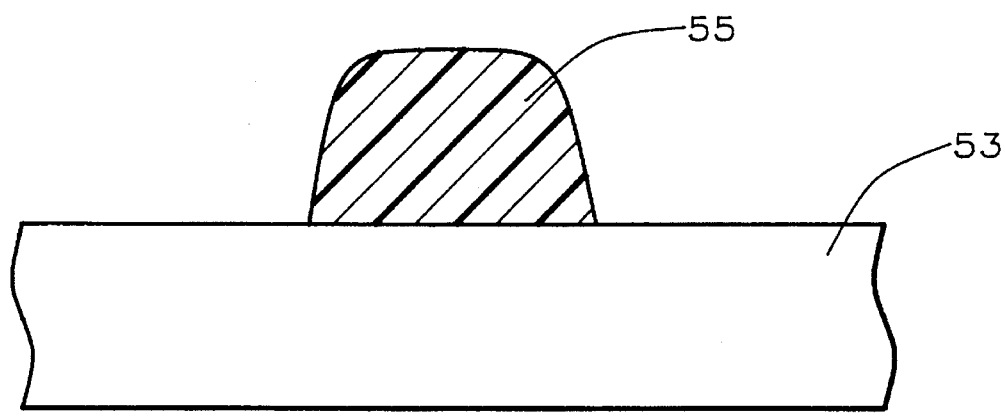
FIG. 5 shows the resulting positive photoresist pattern on the surface of the integrated circuit wafer.

Refer now to FIG. 1 through FIG. 5, there is shown an embodiment of the quantum phase shift mask without chromium. FIG. 1 shows a top view of the mask with a feature pattern 31 of a layer of alternating areas of phase shifting material such as $SiO_2$ 27 with a thickness between about 3000 Angstroms and 5000 Angstroms adjacent to areas of no phase shifting material 29. FIG. 2 shows a cross section of this feature pattern showing the areas of $SiO_2$ adjacent to areas of no phase shifting material. The areas of $SiO_2$ and of the no phase shifting material areas are about 0.1 to 0.5 microns by 0.1 to 0.5 microns. Light 45 is projected through the quantum phase shift mask onto the surface of the integrated circuit wafer. FIG. 3 shows the amplitude of the light passing through the $SiO_2$ 47 and the amplitude of the light passing through no phase shifting material 49 at the exit of the mask. FIG. 4 shows the light intensity 51 at the surface of the integrated circuit wafer. A 5× stepper is used so that the pattern is reduced five times at the surface of the wafer. An intensity null is caused by the interference between the phase shifted light and the non phase shifted light. FIG. 5 shows a cross section of the resulting positive photoresist pattern 55 on the surface of the integrated circuit wafer 53. The quantum phase shift mask produces improved image resolution and depth of focus tolerance at the wafer surface.

Figure 8:
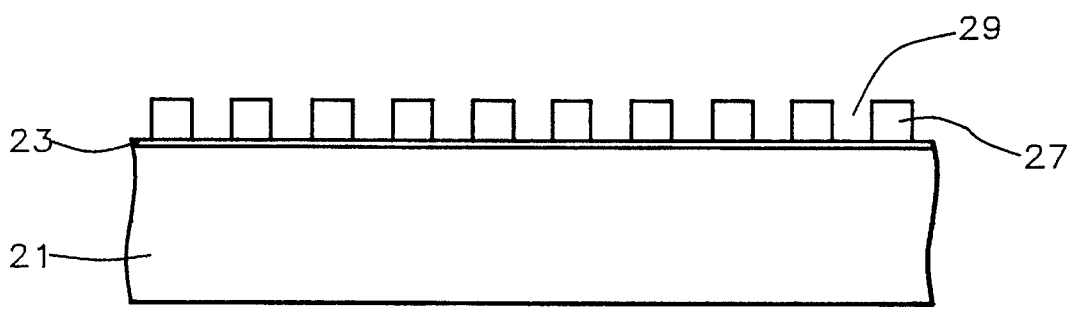
FIG. 8 shows a cross section of the build-on blank after the pattern has been formed in the phase shifting material.
Figure 9:
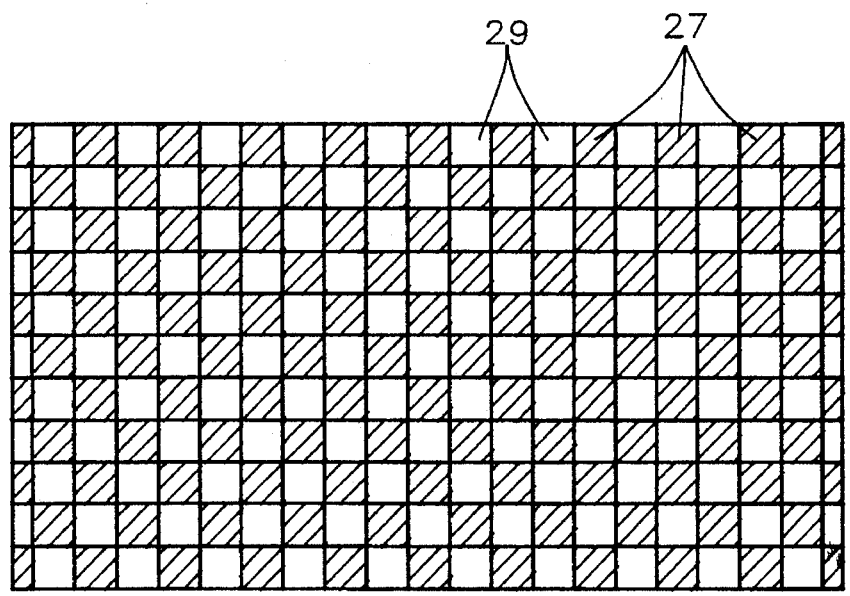
FIG. 9 shows a top view of the completed build-on blank.

Refer now to FIG. 8 and FIG. 9, there is shown an embodiment of the quantum phase shift build-on blank without chromium. FIG. 8 shows a cross section of the build-on blank showing a layer of etching stopper material 23 such as $Al_2O_3$ with a thickness between about 100 Angstroms and 500 Angstroms formed on a quartz substrate 21 with a thickness between about 1 mm and 10 mm. A layer of alternating areas of phase shifting material 27 such as $SiO_2$ and no phase shifting material 29 is formed on the layer of $Al_2O_3$ with a thickness of $SiO_2$ between about 3000 Angstroms and 6000 Angstroms. The dimensions of the $SiO_2$ 27 and non phase shifting material 29 areas are between about 0.1 and 0.5 microns by between about 0.1 and 0.5 microns. When focused on the surface of the integrated circuit wafer the pattern will be reduced five times. FIG. 9 shows the top view of the build-on blank showing the areas of $SiO_2$ 27 and non phase shifting material 29. The regular array of the phase shifting material 27 and no phase shifting material 29 greatly simplifies the inspection of the build-on blank. The build-on blank can be stored until needed for integrated circuit fabrication at which time a feature pattern is formed in the layer of alternating areas of phase shifting material and areas of no phase shifting material. The mask is then used to project a pattern on an integrated circuit wafer surface as described in the previous embodiment.

Figure 6:
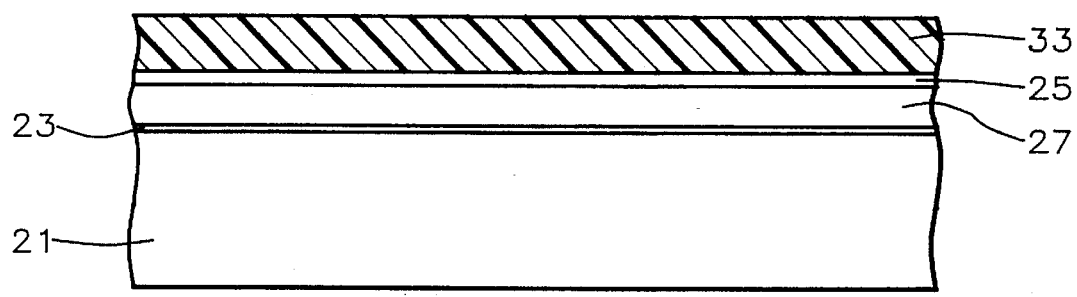
FIG. 6 shows a cross section of the build-on blank prior exposing the photoresist.

Refer now to FIG. 6 through FIG. 9, there is shown an embodiment of a method of forming the quantum phase shift build-on blank. FIG. 6 shows cross section of the build-on blank prior to exposing the photoresist 33. A layer of etching stopper material 23 such as $Al_2O_3$ with a thickness between about 100 Angstroms and 500 Angstroms is formed on a quartz substrate 21 with a thickness between about 1 mm and 10 mm. A layer of phase shifting material 27 such as $SiO_2$ with a thickness of between about 3000 Angstroms and 5000 Angstroms is formed on the layer of etching stopper material. A layer of antistatic material 25 such as $Al_2O_3$ with a thickness between about 100 Angstroms and 500 Angstroms is formed on the layer of $SiO_2$. A layer of photoresist 33 is formed on the layer of antistatic material 25.

Figure 7:
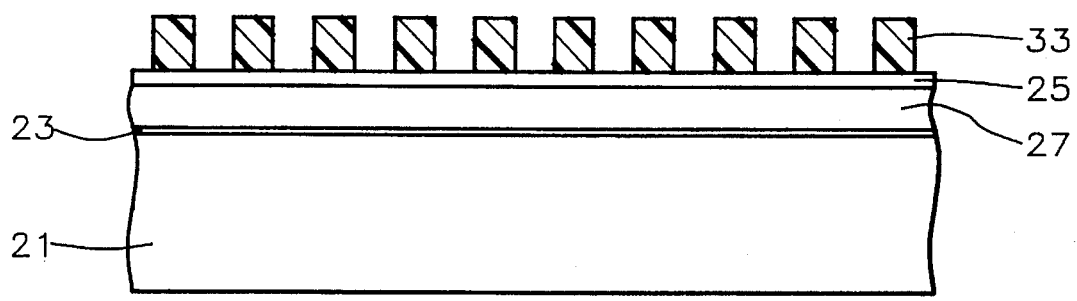
FIG. 7 shows a cross section of the build-on blank after the photoresist has been exposed and developed.

As shown in FIG. 7 the photoresist layer 33 is then exposed using electron beam techniques and developed. As shown in FIG. 8 the alternating areas of $SiO_2$ 27 and no phase shifting material 29 are etched in the layer of $SiO_2$ 27 by means of reactive ion etching, the photoresist is stripped, and the build-on blank is ready to be used or stored. FIG. 9 shows the top view of the build-on blank. The areas of phase shifting material and no phase shifting material are between about 0.1 and 0.5 microns by between about 0.1 and 0.5 microns. A 5× stepper will be used to focus the pattern on the surface of an integrated circuit so that the pattern will be reduced five times at the surface of the integrated circuit.

Figure 10:
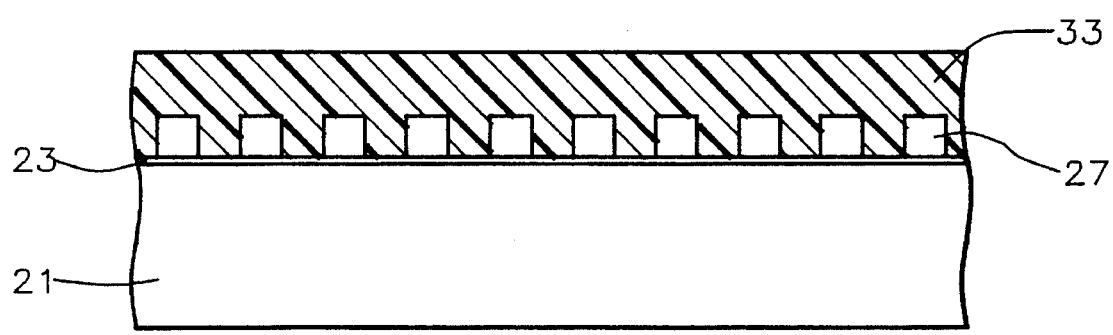
FIG. 10 shows a cross section of the build-on blank with photoresist formed on the surface prior to forming a quantum phase shift mask.
Figure 11:
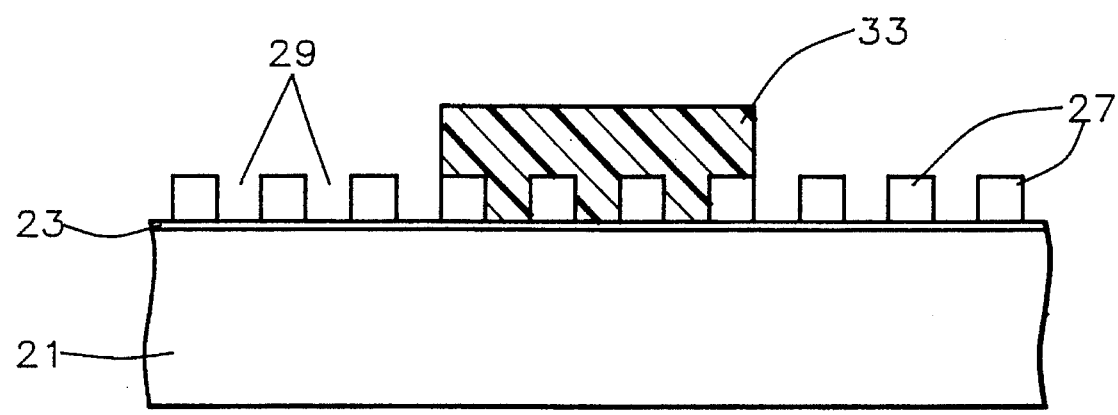
FIG. 11 shows a cross section of the build-on blank with photoresist which has been exposed and developed on the surface.
Figure 12:
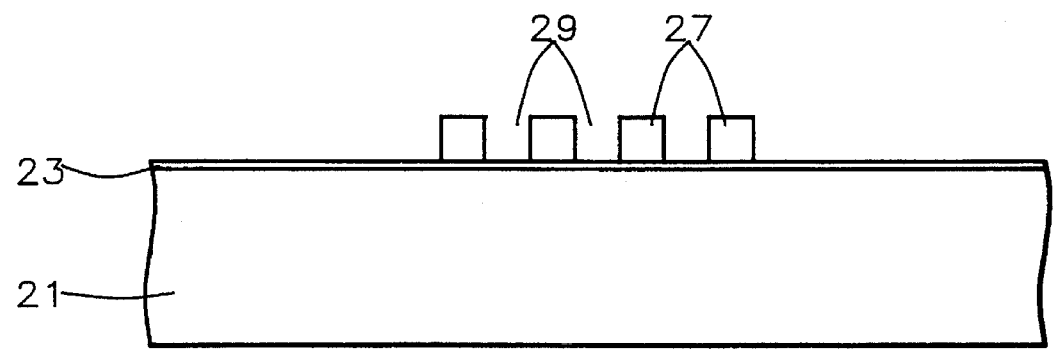
FIG. 12 shows a cross section of a completed quantum phase shift mask formed from a build-on blank.

Refer now to FIG. 10 through FIG. 12, there is shown an embodiment for forming the quantum phase shift mask starting with the build-on blank. FIG. 10 shows a cross section of the build-on blank with photoresist 33 formed over the entire surface. As shown in FIG. 11 the photoresist 33 is exposed using electron beam techniques and developed. The feature pattern is then etched in the alternating areas of $SiO_2$ 27 and no phase shifting material 29 by means of reactive ion etching as shown in FIG. 12 and the quantum phase shift mask has been completed. Little or no modification to the CAD, computer aided design, used for a conventional mask is necessary.

Figure 13:
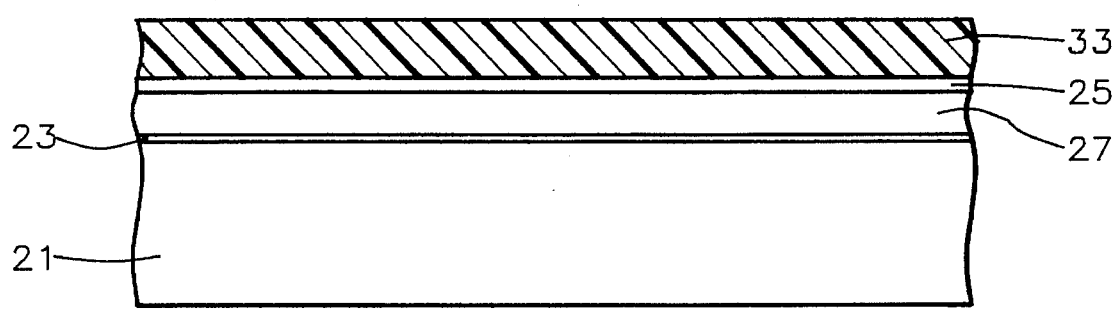
FIG. 13 shows a cross section of the quantum phase shift mask prior to exposing the photoresist.
Figure 14:
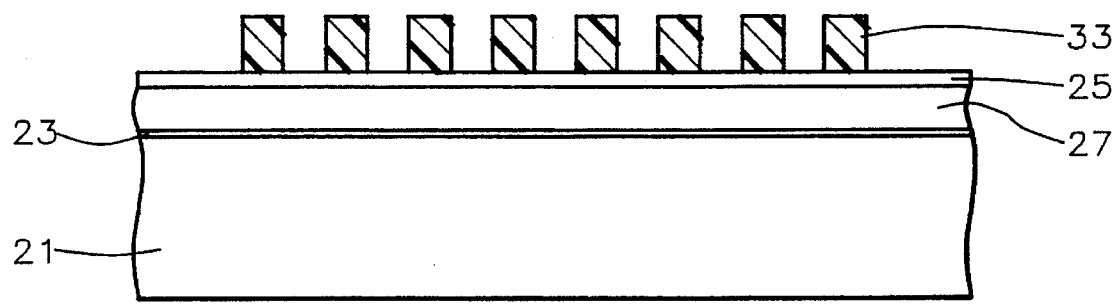
FIG. 14 shows a cross section of the quantum phase shift mask after the photoresist has been exposed and developed.
Figure 15:
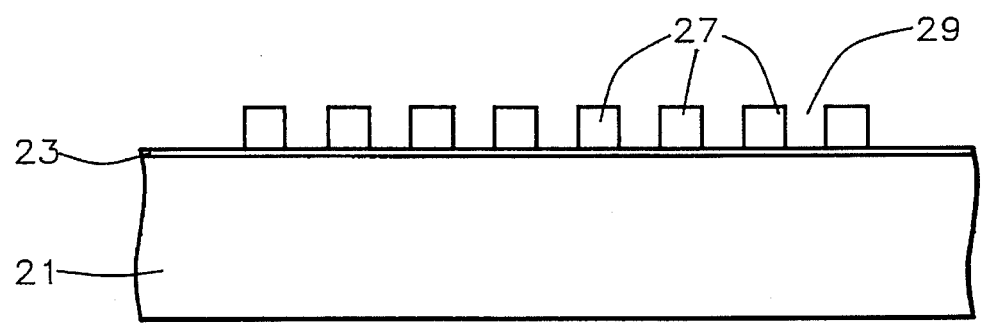
FIG. 15 shows a cross section of the completed quantum phase shift mask.
Figure 16:
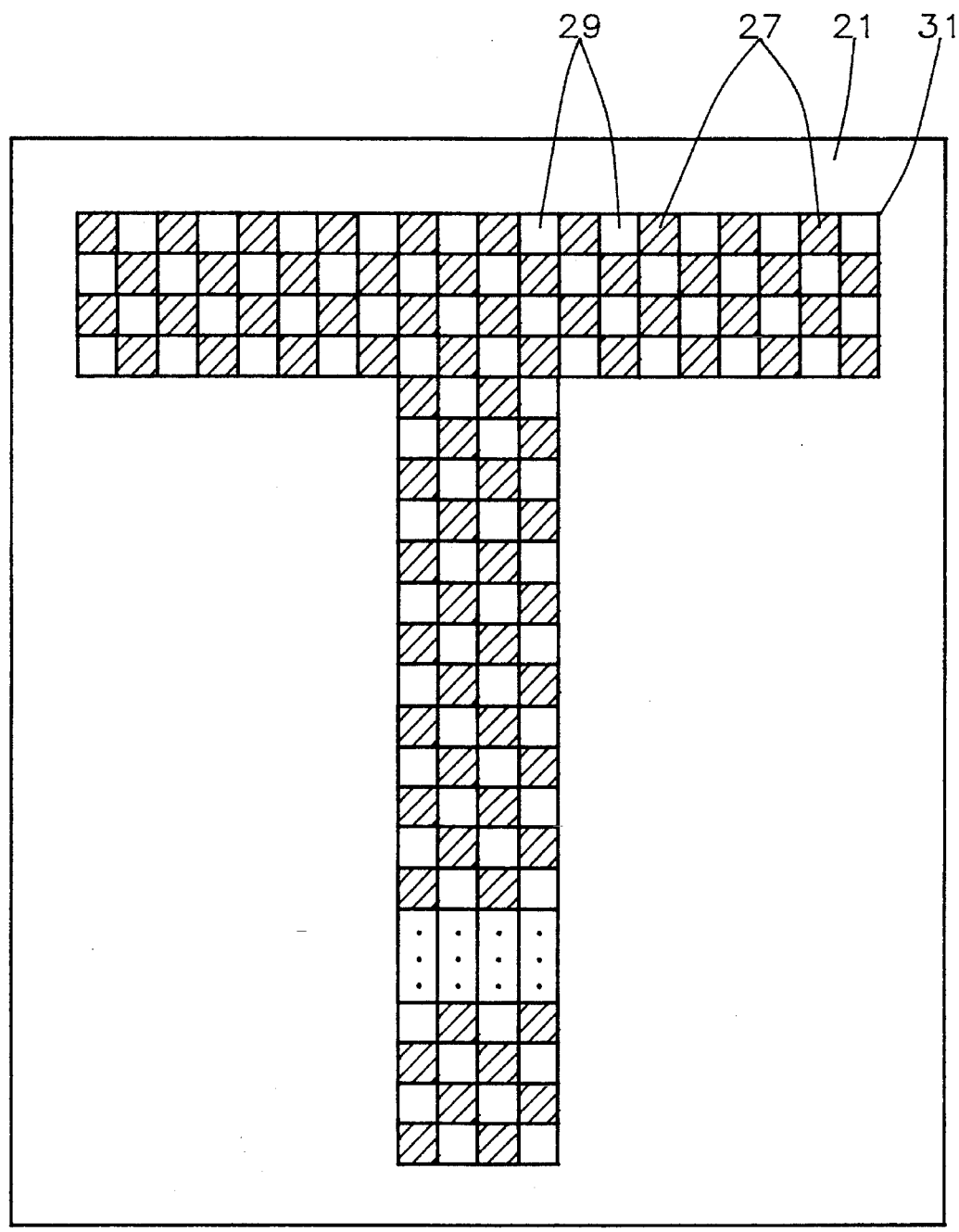
FIG. 16 shows the top view of the completed quantum phase shift mask.

Refer now to FIG. 13 through FIG. 16, there is shown an embodiment of a method of forming the quantum phase shift mask. FIG. 13 shows cross section of the mask prior to exposing the photoresist. A layer of etching stopper material 23 such as $Al_2O_3$ with a thickness between about 100 Angstroms and 500 Angstroms is formed on a quartz substrate 21 with a thickness between about 1 mm and 10 mm. A layer of phase shifting material 27 such as $SiO_2$ with a thickness of between about 3000 Angstroms and 6000 Angstroms is formed on the layer of etching stopper material 23. A layer of antistatic material 25 such as $Al_2O_3$ with a thickness between about 100 Angstroms and 500 Angstroms is formed on the layer of $SiO_2$. A layer of photoresist 33 is formed on the layer of antistatic material 25. As shown in FIG. 14 the feature pattern is exposed on the photoresist 33 using electron beam techniques and the photoresist 33 is developed. As shown in FIG. 15 the feature pattern is then etched in the layer of $SiO_2$ 27 by means of reactive ion etching and the photoresist is stripped completing the mask. FIG. 16 shows the top view of the completed mask. The feature pattern 31 is comprised of alternating areas of phase shifting material 27 adjacent to areas of no phase shifting material 29. The areas of phase shifting material and no phase shifting material are between about 0.1 and 0.5 microns by between about 0.1 and 0.5 microns. The mask will be focussed on the surface of an integrated circuit wafer using a 5× stepper so the pattern will be reduced five times at the surface of the wafer.

While the invention has been particularly shown and described with reference to the preferred embodiments thereof, it will be understood by those skilled in the art that various changes in form and details may be made without departing from the spirit and scope of the invention.

What is claimed is:

1. A method of forming a quantum phase shift mask, comprising the steps of:

providing a transparent substrate;

forming a layer of etching stopper material on said transparent layer;

forming a layer of phase shifting material on said layer of etching stopper material;

forming a layer of anti-static material on said layer of phase shifting material;

forming a layer of photoresist on said layer of anti-static material;

forming a photoresist feature pattern in said photoresist layer by means of exposing said photoresist using electron beam techniques and developing said photoresist, wherein said feature pattern is comprised of alternating areas of photoresist material adjacent to areas of no photoresist material;

etching a phase shifting feature pattern in said phase shifting layer using said photoresist feature pattern as an etching mask, wherein said phase shifting feature pattern is comprised of alternating areas of phase shifting material adjacent to areas of no phase shifting material; and stripping said photoresist material.

2. The method of claim 1 wherein said transparent substrate is quartz with a thickness between about 1 mm and 10 mm.

3. The method of claim 1 wherein said phase shifting material is $SiO_2$ with a thickness between about 3000 Angstroms and 6000 Angstroms.

4. The method of claim 1 wherein said phase shifting material is $Si_3N_4$ with a thickness between about 2000 Angstroms and 5000 Angstroms.

5. The method of claim 1 wherein said areas of phase shifting material are between about 0.1 and 0.5 microns by between about 0.1 and 0.5 microns.

6. The method of claim 1 wherein said areas of no phase shifting material are between about 0.1 and 0.5 microns by between about 0.1 and 0.5 microns.

7. The method of claim 1 wherein said layer of etching stopper material is $Al_2O_3$ with a thickness between about 100 Angstroms and 500 Angstroms.

8. The method of claim 1 wherein said layer of anti-static material is $Al_2O_3$ with a thickness of about 200 Angstroms.

9. The method of claim 1 wherein said layer of anti-static material is FeO with a thickness of about 200 Angstroms.

10. The method of claim 1 wherein said etching of said phase shifter feature pattern is accomplished by means of reactive ion etching.

11. A method of forming a quantum phase shift build-on blank, comprising the steps of:

providing a transparent substrate;

forming a layer of etching stopper material on said transparent layer;

forming a layer of phase shifting material on said layer of etching stopper material;

forming a layer of anti-static material on said layer of phase shifting material;

forming a layer of photoresist on said layer of anti-static material;

forming a pattern in said photoresist layer by means of exposing said photoresist using electron beam techniques and developing said photoresist, wherein said pattern is comprised of alternating areas of photoresist material adjacent to areas of no photoresist material;

etching a pattern in said phase shifting layer using said pattern in said photoresist layer as an etching mask, wherein said pattern in said phase shifting layer is comprised of alternating areas of phase shifting material adjacent to areas of no phase shifting material; and stripping said photoresist material.

12. The method of claim 11 wherein said transparent substrate is quartz with a thickness between about 1 mm and 10 mm.

13. The method of claim 11 wherein said phase shifting material is $SiO_2$ with a thickness between about 3000 Angstroms and 6000 Angstroms.

14. The method of claim 11 wherein said phase shifting material is $Si_3N_4$ with a thickness between about 2000 Angstroms and 5000 Angstroms.

15. The method of claim 11 wherein said areas of phase shifting material are between about 0.1 and 0.5 microns by between about 0.1 and 0.5 microns.

16. The method of claim 11 wherein said areas of no phase shifting material are between about 0.1 and 0.5 microns by between about 0.1 and 0.5 microns.

17. The method of claim 11 wherein said layer of etching stopper material is $Al_2O_3$ with a thickness between about 100 Angstroms and 500 Angstroms.

18. The method of claim 11 wherein said layer of anti-static material is $Al_2O_3$ with a thickness of about 200 Angstroms.

19. The method of claim 11 wherein said layer of anti-static material is FeO with a thickness of about 200 Angstroms.

20. The method of claim 11 wherein Said etching of said pattern in slid phase shifting layer is accomplished by means of reactive ion etching.

21. A method of forming a quantum phase shift mask, comprising the steps of:

providing a quantum phase shift build-on blank comprised of a transparent substrate, a layer of etching stopper material formed on said transparent substrate, and a layer of alternating areas of phase shifting material adjacent to areas of no phase shifting material formed on said layer of etching stopper material;

forming a layer of photoresist on said build-on blank;

forming a feature pattern in said layer of photoresist by means of exposing said photoresist using electron beam techniques and developing said photoresist;

forming said feature pattern on said build-on blank by means of etching away said phase shifting material not covered by said feature pattern in said layer of photoresist; and stripping said layer of photoresist.

22. The method of claim 21 Wherein said transparent substrate is quartz with a thickness between about 1 mm and 10 mm.

23. The method of claim 21 wherein said phase shifting material is $SiO_2$ with a thickness between about 3000 Angstroms and 6000 Angstroms.

24. The method of claim 21 wherein said phase shifting material is $Si_3N_4$ with a thickness between about 2000 Angstroms and 5000 Angstroms.

25. The method of claim 21 wherein said areas of phase shifting material are between about 0.1 and 0.5 microns by between about 0.1 and 0.5 microns.

26. The method of claim 21 wherein said areas of no phase shifting material are between about 0.1 and 0.5 microns by between about 0.1 and 0.5 microns.

27. The method of claim 21 wherein said layer of etching stopper material is $Al_2O_3$ with a thickness between about 100 Angstroms and 500 Angstroms.

28. The method of claim 21 wherein said etching of said feature pattern in said phase shifting layer is accomplished by means of reactive ion etching.

* * * * *